(12) United States Patent
Kawabata et al.

(10) Patent No.: US 8,716,868 B2
(45) Date of Patent: May 6, 2014

(54) SEMICONDUCTOR MODULE FOR STACKING AND STACKED SEMICONDUCTOR MODULE

(75) Inventors: Takeshi Kawabata, Osaka (JP); Takashi Yui, Shiga (JP)

(73) Assignee: Panasonic Corporation, Osaka (JP)

( * ) Notice: Subject to any disclaimer, the term of this patent is extended or adjusted under 35 U.S.C. 154(b) by 466 days.

(21) Appl. No.: 12/783,836

(22) Filed: May 20, 2010

(65) Prior Publication Data

US 2010/0295186 A1    Nov. 25, 2010

(30) Foreign Application Priority Data

May 20, 2009 (JP) .................................. 2009-121483
Apr. 15, 2010 (KR) ......................... 10-2010-0034715

(51) Int. Cl.
H01L 23/48 (2006.01)

(52) U.S. Cl.
USPC .......................................... 257/773; 257/779

(58) Field of Classification Search
USPC .................. 257/773, 777, 778, 779, E23.023, 257/E25.013, 686, E25.027
See application file for complete search history.

(56) References Cited

U.S. PATENT DOCUMENTS

| | | | |
|---|---|---|---|
| 5,222,014 A | 6/1993 | Lin | |
| 6,132,543 A | 10/2000 | Mohri et al. | |
| 7,078,629 B2 * | 7/2006 | Umemoto | 174/260 |
| 7,091,619 B2 | 8/2006 | Aoyagi | |
| 7,358,445 B1 * | 4/2008 | Mohri et al. | 174/255 |
| 7,498,668 B2 | 3/2009 | Kawabata et al. | |
| 7,906,733 B2 | 3/2011 | Kumakura | |
| 2003/0197260 A1 * | 10/2003 | Nishimura et al. | 257/686 |
| 2004/0222510 A1 | 11/2004 | Aoyagi | |
| 2005/0184377 A1 | 8/2005 | Takeuchi et al. | |
| 2007/0052081 A1 | 3/2007 | Gerber et al. | |
| 2007/0289777 A1 * | 12/2007 | Pendse | 174/520 |
| 2009/0065773 A1 | 3/2009 | Ishikawa et al. | |
| 2009/0146301 A1 | 6/2009 | Shimizu et al. | |
| 2009/0283900 A1 | 11/2009 | Yamada | |
| 2009/0294945 A1 | 12/2009 | Okada et al. | |

FOREIGN PATENT DOCUMENTS

| | | |
|---|---|---|
| JP | 06-013541 | 1/1994 |
| JP | 09-051017 | 2/1997 |
| JP | 11-233936 | 8/1999 |
| JP | 2000-208557 | 7/2000 |
| JP | 2004-289002 | 10/2004 |
| JP | 2006-303079 | 11/2006 |

(Continued)

*Primary Examiner* — Yu-Hsi D Sun
(74) *Attorney, Agent, or Firm* — Hamre, Schumann, Mueller & Larson, P.C.

(57) ABSTRACT

A pad (15) is provided on a surface connecting a first substrate (11) of a lower layer module with an upper layer module, the pad is partially covered by an insulating film (20) to form an opening section (3) exposing the pad (15), a first connection terminal (2) is formed on the lower surface of the first substrate (11) of the lower layer module, the planar shape of the opening section (3) is different from the planar shape of the first connection terminal (2), the outer shape of the opening section (3) is larger than the first connection terminal (2), and in a transmissive inspection from above, the shape of the lower end of a second connection terminal (30) spreading in the opening section (3) is not concealed by the other terminal. This configuration enables easy and reliable determination of whether bonding sections are satisfactory by a non-destructive inspection.

5 Claims, 8 Drawing Sheets

(56) References Cited

FOREIGN PATENT DOCUMENTS

| | | |
|---|---|---|
| JP | 2007-103681 | 4/2007 |
| JP | 2007-115789 | 5/2007 |
| JP | 2007-123466 | 5/2007 |
| JP | 2007-123545 | 5/2007 |
| JP | 2008-108846 | 5/2008 |
| JP | 2008-294014 | 12/2008 |
| JP | 2009-70965 | 4/2009 |

* cited by examiner (a)

(b)

(c)

(d)

(a)

(b)

(a)

(b)

SEMICONDUCTOR MODULE FOR STACKING AND STACKED SEMICONDUCTOR MODULE

BACKGROUND OF THE INVENTION

1. Field of the Invention

The present invention relates to a semiconductor module for stacking, which is disposed in a lowermost layer when a plurality of semiconductor devices are stacked together, and to a stacked semiconductor module using the same.

2. Description of the Related Art

With demands for miniaturization and improved functionality of electronic devices of various kinds, such as portable telephone devices or digital still cameras, stacked semiconductor modules (package on package) have been developed, in which electronic components, in particular, a plurality of semiconductor devices and chips are stacked together and united in a single body.

In mounting of such a stacked semiconductor module, a connection yield between upper and lower packages due to ever higher density and ah improvement in inspection sensitivity in line with higher functionality have become an issue, and in response to this, an inspection yield has been required to be improved by improving the quality.

Japanese Patent Application Laid-Open No. 2004-363126 and the like disclose a conventional stacked semiconductor module. FIG. 8A shows the conventional stacked semiconductor module, in which a second package PK2 is stacked and mounted on a first package PK1.

External connection terminals 2 are provided on the lower surface of the first package PK1 and upper/lower connection terminals 1 are provided on the upper surface of the first package PK1. In a normal product, the upper/lower connection terminals 1 are bonded onto upper layer module connection pads 15a formed on the upper surface of the first package PK1. Furthermore, the shape of the connection surface of the upper/lower connection terminal 1 and the shape of the external connection terminal 2 are both a similar circular shape. Moreover, the upper layer module connection pads 15a also have a circular shape, as shown in FIG. 8B.

Japanese Patent Application Laid-Open No. 2000-208557 describes improved connection reliability between a printed substrate and a semiconductor device by forming lands 4 provided on a substrate 11 of the semiconductor device in a rectangular, elliptical or oval shape, or the like, so as to be elongated in the direction of thermal expansion, as shown in FIG. 9.

Normally, an electrical inspection is used to judge connections between upper and lower semiconductor devices. Specifically, generally a re-inspection is carried out on a completed stacked product after connection of the upper and lower devices, in order to check the connection status between the upper and lower devices and ensure electrical properties.

In this inspection, the stacked semiconductor module is inserted into a socket of an inspection apparatus, the external connection terminals 2 of the first package PK1 are brought into contact with a probe on the socket side by applying a load from above, and the electrical conduction in the connecting portion between the first package PK1 and the second package PK2 is judged via the internal wiring of the stacked semiconductor module.

However, in such an electrical inspection, if the bonding state between the first package PK1 and the second package PK2 is not reliable and it is not certain whether or not the packages are simply in contact with each other, an electrically conducting contact may be achieved temporarily in the connecting portion between the first package PK1 and the second package PK2 due to the load applied during the inspection, and the product may be judged as "electrically satisfactory" and pass the inspection.

Therefore, in order to judge whether or not a sound physical bond is formed between the upper and lower connection terminals and electrical connection is maintained therebetween, rather than the upper and lower connection terminals simply contacting each other, an X-ray inspection or ultrasonic inspection (SAT: Scanning Acoustic Tomograph) is used to perform a non-contact transmissive inspection.

However, in such a transmissive inspection, visual judgment requires quite a long time, and automatic judgment makes it difficult to set a threshold value, so that it is extremely difficult to judge defects with respect to whether or not a bond has been made.

Specifically, in the example shown in FIGS. 8A and 8B, since the shape of the pads 15a is circular, and the external connection terminals 2 also have a circular ball shape, the pads and external connection terminals both produce the same circular shape even when the stacked semiconductor module is observed by transmission from above in the non-contact transmissive inspection. Moreover, while the connection surface presents a circular shape when the upper and lower terminals are in a bonded state, even if the upper and lower terminals are in an unbonded state or a non-contact state, the planar shape of the ball of the upper terminal itself is visible and presents the same shape. Since connection terminals of the same shape such as the lowermost terminals and the upper terminals are used in combination, regardless of their size, then even in an unbonded state, the size and shape are obviously the same as in a bonded state, and since the shape is the same as that of the other connection terminals, then it is difficult to distinguish bonded locations and the other connection terminals.

As shown in FIG. 9, Japanese Patent Application Laid-Open No. 2000-208557 discloses a technology aimed at improving the connection strength of the semiconductor device with respect to the printed substrate by forming the lands 4 in a rectangular shape. However, this technology clearly does not address the issue of the inspection in which terminals are present in upper and lower positions in a stacked state as in the stacked semiconductor module.

Specifically, since differences with respect to the upper and lower connection terminals and differences in shape in the respective connecting portions are not made clear simply by using the rectangular lands as seen in Japanese Patent Application Laid-Open No. 2000-208557 in the upper and lower connection terminals, then in the transmissive inspection using X-rays or the like, there is a possibility that connection terminals of the same shape, such as the lowermost terminals and the terminals between the upper and lower devices, are mixed.

SUMMARY OF THE INVENTION

It is an object of the present invention to provide a semiconductor module for stacking and a stacked semiconductor module whereby whether or not the quality of bonding sections is satisfactory can be judged readily and reliably in a non-destructive inspection, and thus the quality and reliability can be improved.

In a semiconductor module for stacking according to the present invention, a pad electrically connectable to an upper layer module is provided outside the holding region of a first semiconductor chip mounted on one of surfaces of a first substrate provided with a first connection terminal formed on the other one of the surfaces, an opening section opened so as to expose the pad is formed in an insulating film formed on the one of the surfaces of the first substrate so as to cover a portion of the pad, the planar shape of the opening section is different from the planar shape of the first connection terminal, and the outer shape of the opening section protrudes beyond the first connection terminal when inspected by transmission in the stacking direction of the first connection terminal and the opening section.

Furthermore, a stacked semiconductor module according to the present invention is a stacked semiconductor module, in which a second substrate provided with a second semiconductor chip thereon is stacked on top of one of surfaces of a first substrate provided with a first semiconductor chip on the one of the surfaces, the first substrate and the second substrate being connected by a second connection terminal, wherein a pad electrically connectable to the second substrate is provided outside the holding region of the first semiconductor chip on the one of the surfaces of the first substrate, an opening section opened so as to expose the pad is formed in an insulating film formed on the one of the surfaces of the first substrate so as to cover a portion of the pad, the planar shape of the opening section is different from the planar shape of the second connection terminal and the planar shape of a first connection terminal formed on the other one of the surfaces of the first substrate, and with one end of the second connection terminal being connected to the second substrate, the other end thereof melts and solidifies, fills the opening section and is bonded to the pad, and the outer shape of the opening section protrudes beyond the second connection terminal and the first connection terminal when inspected by transmission in the stacking direction of the first connection terminal and the opening section.

With this configuration, in the stacked semiconductor module, the planar shape of the second connection terminal connecting the lower layer module and the upper layer module and the planar shape of the first connection terminal formed on the other surface of the first substrate are made different from the shape of a connection surface between the other end of the second connection terminal and the pad on the first substrate, and when inspected by transmission in the stacking direction of the first connection terminal and the opening section, the outer shape of the opening section protrudes beyond the first connection terminal, or the outer shape of the opening section is larger than the second connection terminal and the first connection terminal, and thus the shape clearly differs between an unbonded state and a bonded state of the lower layer module and the upper layer module. Moreover, in a transmissive inspection from above, the planar shape of the second connection terminal which fills the opening section and is bonded to the pad is not concealed by the other terminal, and thus it is possible to readily distinguish the shape difference by the transmissive inspection from above. Consequently, it is possible to reliably carry out the inspection of the bonding sections between the upper layer and lower layer modules, and to supply a semiconductor device and module having high quality and reliability.

DESCRIPTION OF THE PREFERRED EMBODIMENTS

Figure 1:
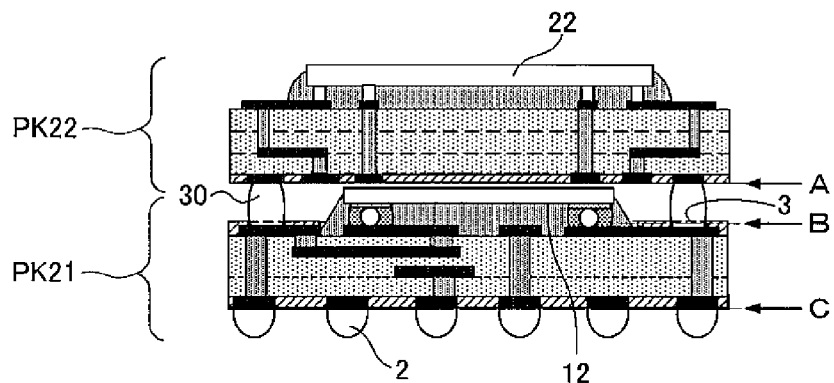
FIG. 1A is a cross-sectional diagram of a stacked semiconductor module according to an embodiment of the present invention.
FIG. 1B is a cross-sectional diagram of a connection surface A.
FIG. 1C is a cross-sectional diagram of a connection surface B.
FIG. 1D is a cross-sectional diagram of a connection surface C.
Figure 1:
Figure 1:
Figure 1:

Below, an embodiment of the present invention is described with reference to FIG. 1 to FIG. 7.

FIG. 1A shows a stacked semiconductor module according to the present invention. The numbers and shapes of terminals, electrodes, wires, and the like are omitted or are set such that they are easily shown in the drawings. Similar omissions and the like are made in all of the diagrams described below.

A second package PK22 is stacked and mounted on a first package PK21. A first semiconductor chip 12 is mounted on the upper surface of the first package PK21, and a second semiconductor chip 22 is mounted on the upper surface of a second substrate 25 of the second package PK22.

Specifically, the second package PK22 is a general-purpose memory device for stacking or the like, in which the second semiconductor chip 22 such as a memory is mounted on the substrate, electrodes are connected electrically by wire bonding or a flip-chip technique, and in some cases, the semiconductor chip is sealed or coated with resin so as to cover the chip.

Figure 2:
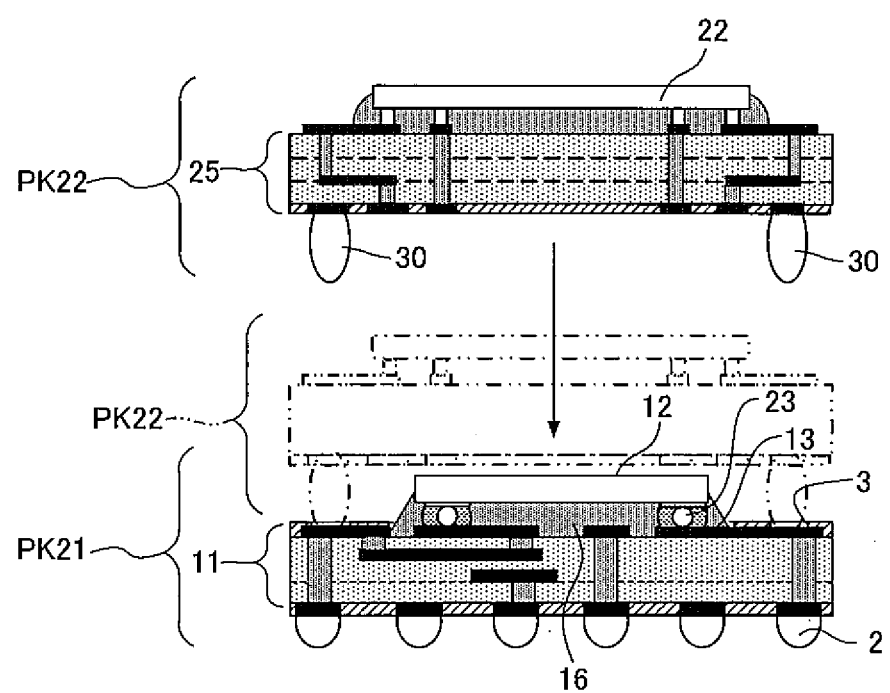
FIG. 2 is an illustrative diagram of a method of manufacturing the stacked semiconductor module according to the embodiment.

FIG. 2 shows a step of stacking the first package PK21 and the second package PK22. Second connection terminals 30 are formed on the second package PK22 for bonding to the first package PK21. Generally, solder balls made of a solder material such as SnPb, SnAgCu, SnCu and SnBi are used as a bonding metal which constitutes the connection terminals 30.

Figure 3:
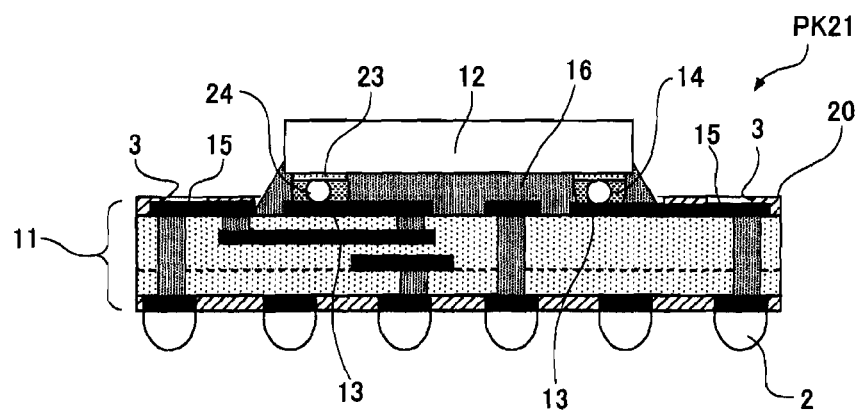
FIG. 3 is a cross-sectional diagram of a lower layer module of a semiconductor device for stacking according to the embodiment.

The first package PK21 of the semiconductor module for stacking, which is a lower-layer module, is configured as shown in FIG. 3.

The first package PK21 is constituted by a first substrate 11 and the first semiconductor chip 12 which is mounted on the chip holding surface of the first substrate 11.

In the first semiconductor chip 12, an integrated circuit forming region (not illustrated) where a semiconductor element is formed is provided in the central portion of a chip substrate having a square planar shape, and a plurality of first chip terminals 23 are provided on the outer side of this region. The first chip terminals 23 are generally formed from the same metal as a metal used to form the wires of an integrated circuit, and are made of aluminum, copper, a stacked material of aluminum and copper, or the like. The surface of the chip substrate is covered with an insulating film such as polyimide (not illustrated), apart from the region where the first chip terminals 23 are formed. The first chip terminals 23 may be disposed inside the integrated circuit forming region. Projecting electrodes 24 are formed on the first chip terminals 23 by a commonly known method such as a wire bonding method or plating method.

The projecting electrodes 24 provided on the first chip terminals 23 may be stacked bodies composed of one or at least two of solder, gold, copper, nickel, and the like, and may be sphere-shaped or cylinder-shaped bumps.

The first substrate 11 has a multi-layer wiring structure made of aramide resin, glass epoxy resin, polyimide resin, ceramic, or the like. A plurality of first chip connection terminals 13 are provided on the chip holding surface of the first substrate 11 at positions corresponding to the projecting electrodes 24 provided on the first semiconductor chip 12.

The first semiconductor chip 12 is flip-chip mounted on the first substrate 11, and the projecting electrodes 24 of the first semiconductor chip 12 are electrically connected to the first chip connection terminals 13 by means of a conductive adhesive material 14. Moreover, underfill resin 16 is filled in between the first semiconductor chip 12 and the first substrate 11 in order to reinforce the connection therebetween. It is also possible to connect the first semiconductor chip 12 and the first substrate 11 by using a connection method which involves the curing contraction of a non-conductive resin film, instead of the underfill resin 16.

A plurality of first connection terminals 2 for external connection are disposed in an equally-spaced lattice formation, on the surface (rear surface) of the first substrate 11 opposite to the chip holding surface. The first connection terminal 2 can be connected electrically to an external substrate (not illustrated) which is a printed substrate. Normally, a ball-shaped member made of a solder material such as SnPb, SnAgCu, SnCu or SnBi, or a metal such as gold, copper or nickel is disposed as the material of the first connection terminals 2, and the material can be melted and bonded onto the first substrate 11 by reflow heating to the melting point thereof or above. Furthermore, for the first connection terminals 2, it is also possible to use resin balls to which conductive properties have been imparted in the surface layer by carrying out metal vapor deposition or the like.

A plurality of upper layer module connection pads 15 for connection to the second package PK22 as the upper layer module of the stacked semiconductor module are provided in the outside portion of the holding region of the first semiconductor chip 12 on the chip holding surface of the first substrate 11. Moreover, the upper sides of the pads 15 are partially covered with an insulating film 20 such as a solder resist or polyimide, and portions of the pads 15 are exposed by means of upper layer module connection opening sections 3. The portions exposed via the opening sections 3 are subjected to surface treatment by plating, such as nickel plating or gold plating, thereby preventing oxidation of the pads of the lower layer. The insulating film 20, such as a solder resist or polyimide, is formed also on the surface of the first substrate 11 opposite to the chip holding surface (the rear surface), apart from the portion where the first connection terminals 2 are formed.

Figure 4:
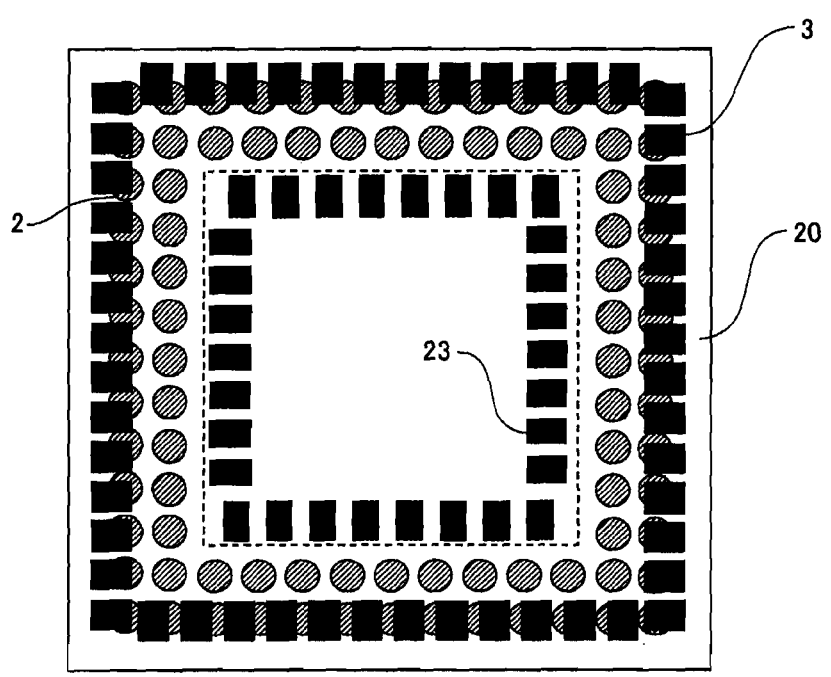
FIG. 4 is a plan diagram of a projected state of a first substrate 11 according to the embodiment.
Figure 5:
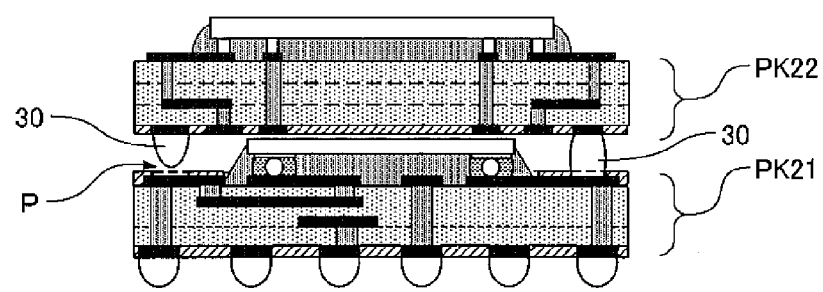
FIG. 5A is a cross-sectional diagram of the stacked semiconductor module being partially unbonded in the embodiment.
FIG. 5B is an image obtained by transmissive observation from above, using an X-ray transmission apparatus.
Figure 5:
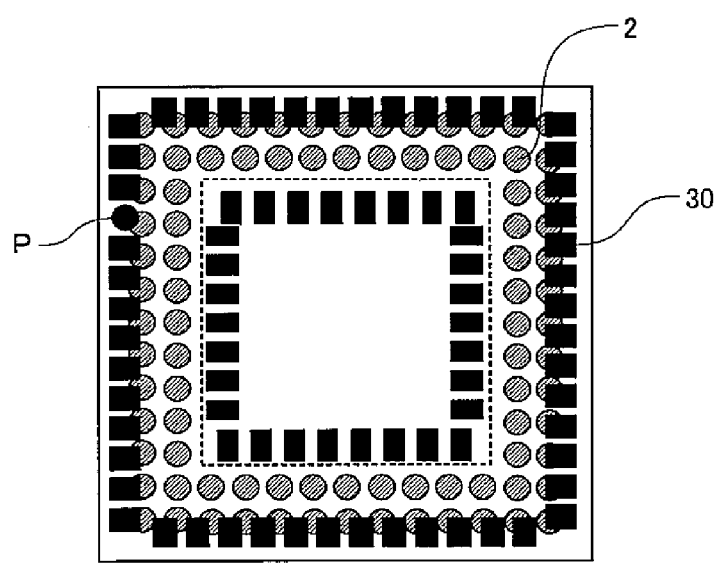
Figure 6:
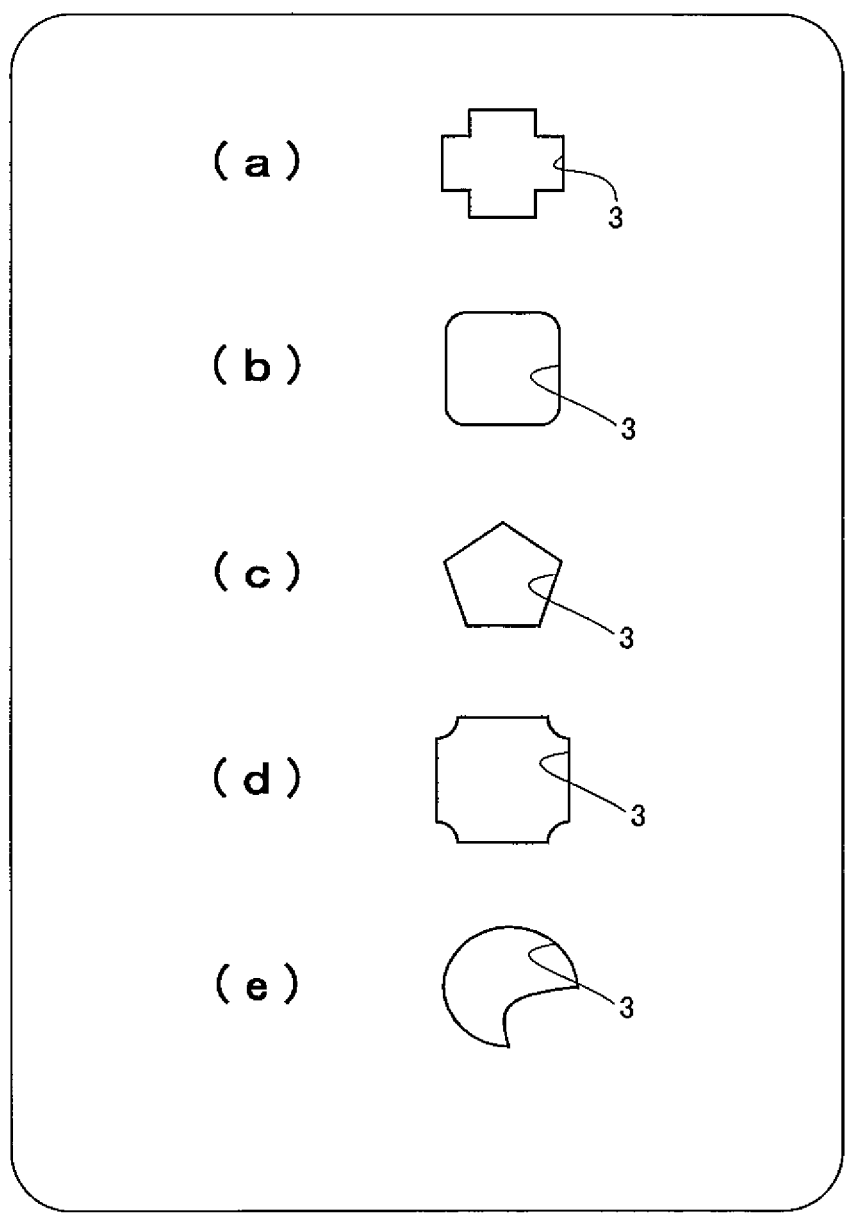
FIGS. 6A to 6E are enlarged plan diagrams showing the shapes of an opening section in the embodiment.

FIG. 4 shows a detailed view of the first substrate 11 of the first package PK21.

FIG. 4 shows a projected diagram of the first connection terminals 2 in addition to the plan diagram shown in FIG. 3.

Here, the opening sections 3 have a square opening shape, whereas the first connection terminals 2 are solder balls and have a circular shape, and thus the opening sections and first connection terminals have different planar shapes. Moreover, the outer shape of the opening sections 3 is larger than the external connection terminals 2.

The characteristic of the present embodiment is a difference in shape and size between the opening sections 3 of the first package PK21 and the first connection terminals 2, which allows the connection state of the first package PK21 and the second package PK22 to be determined readily by means of a non-contact transmissive inspection as described below.

With the second package PK22 being mounted on the first package PK21 configured thus, as shown in FIG. 2, by, in this state, melting and then solidifying the material of the connection terminals 30 by reflow heating to the melting point of the material or above, the lower ends of the connection terminals 30 are soldered and bonded to the pads 15 on the first package PK21 and the first package PK21 is electrically connected to the second package PK22 via the connection terminals 30.

The bottom surfaces of the melted connection terminals 30 assume substantially the same shape as the opening shape of the opening sections 3, by wetting and spreading in a form following the shape of the opening sections 3 and then solidifying. FIG. 1B is a cross-sectional diagram of a connection surface A between the second package PK22 and one of the connection terminals 30 in the stacked semiconductor module formed in this way, FIG. 1C is a cross-sectional diagram of a connection surface B between the first package PK21 and one of the connection terminals 30, and FIG. 1D is a cross-sectional diagram of a connection surface C between the first package PK21 and one of the first connection terminals 2.

When the stacked semiconductor module is observed by transmission from above by means of an X-ray transmission apparatus or the like, since the bottom surface of the connection terminal 30 has spread throughout the whole opening section 3 and the outer shape of the square of the opening section 3, in a normal bonding state where the opening section 3 has been filled with the solidified material of the connection terminal 30, is formed to be larger than the first connection terminal 2, then in the transmissive observation from above by X-rays or the like, an image of the connection surface of the connection terminal 30 is not concealed, even in a position where the connection terminal 30 overlaps with the first connection terminal 2 of the lower layer module, and as shown in FIG. 4, the bottom surface of the connection terminal 30, in other words, the square shape of the opening section 3, can be observed protruding beyond the shadow of the first connection terminal 2 disposed therebelow.

On the other hand, in the case of an unbonded state where a wetting defect occurs, or in the case where a bonding defect occurs as indicated by P on the left-hand side of the connection terminal 30 shown in FIG. 5A, since the bottom surface of the connection terminal 30 does not spread through the whole opening section 3, a circular bottom surface close to the shape of the original connection terminal 30 is formed. When a stacked semiconductor module having this bonding defect is observed by transmission from above using an X-ray transmission apparatus, then since the opening sections 3 and the pads themselves have a small thickness of 10 µm to 20 µm, they are not transferred clearly as transmission images. Only an image of the unbonded terminal of the connection terminal 30, which has a relatively large thickness of, for example, 100 µm or more, is output as a very clear circular shape. FIG. 5B shows an example of the determination of the bonding defect location P.

As can be seen from a comparison of FIG. 5A and FIG. 5B, in the case of normal bonding, the presence of a square shape can be observed and in the case of an unbonded state, the original circular shape of the connection terminals can be observed. Therefore, the connection state of the first package PK21 with respect to the second package PK22 can be determined readily. By this means, it is possible to achieve a stacked semiconductor module having high reliability by means of a simple inspection process, by assembling the stacked semiconductor module using the first package PK21 having the structure shown in FIG. 3 as the lower layer module.

In the embodiment described above, a case where the opening sections 3 have a square shape was described, but they may also have a polygonal shape having more than four corners. Specific examples are shown in FIGS. 6A to 6E.

FIG. 6A shows a case where the opening section 3 has a cross shape, FIG. 6B shows a case where the opening section 3 has a square shape and the corners are rounded, FIG. 6C shows a case where the opening section 3 has a pentagonal shape, FIG. 6D shows a case where the opening section 3 has a square shape and the corner sections are rounded so as to project toward the inner side, and FIG. 6E shows a case where the opening section 3 has a partially deformed elliptical shape. In each of these cases, the outer shape of the polygon of the opening section 3 is greater than the diameter of the first connection terminal 2. In this way, the opening section 3 may have a cross shape, a square shape with curved corners, a pentagonal shape, a polygonal shape including a circular arc in a portion of the edges, a polygonal shape completely having curved corners, or the like.

Rounding the corner portions of the opening section 3 is effective because it makes it possible to reduce residues of a resist and foreign material, compared to a case where the corner portions of the opening section 3 are not rounded.

The opening section 3 may be large enough to encompass the whole diameter of the first connection terminal 2, and may be of a size such that the whole shape of the connection terminal can be concealed. For example, since, in practice, the level of variation in the external terminal diameter is approximately 0.01 mm or less, and variation in the opening size is approximately 0.01 mm, the opening section is desirably set to be larger than the terminal diameter by at least a root mean square of 0.015 mm or more. Consequently, substantially the whole connection surface in the opening section can be observed without being concealed by the diameter of the external connection terminal.

Specifically, the opening section may be set to have a polygonal shape such as a quadrilateral shape having an opening of 0.315 mm, which is larger than a ball diameter of approximately 0.3 mm. Furthermore, when the opening section 3 and the first connection terminal 2 are viewed on a projected plane, then a difference with respect to the circular shape can be recognized readily and clearly if the linear portions or angled portions of the polygonal shape of the opening section 3 are visible.

Figure 7:
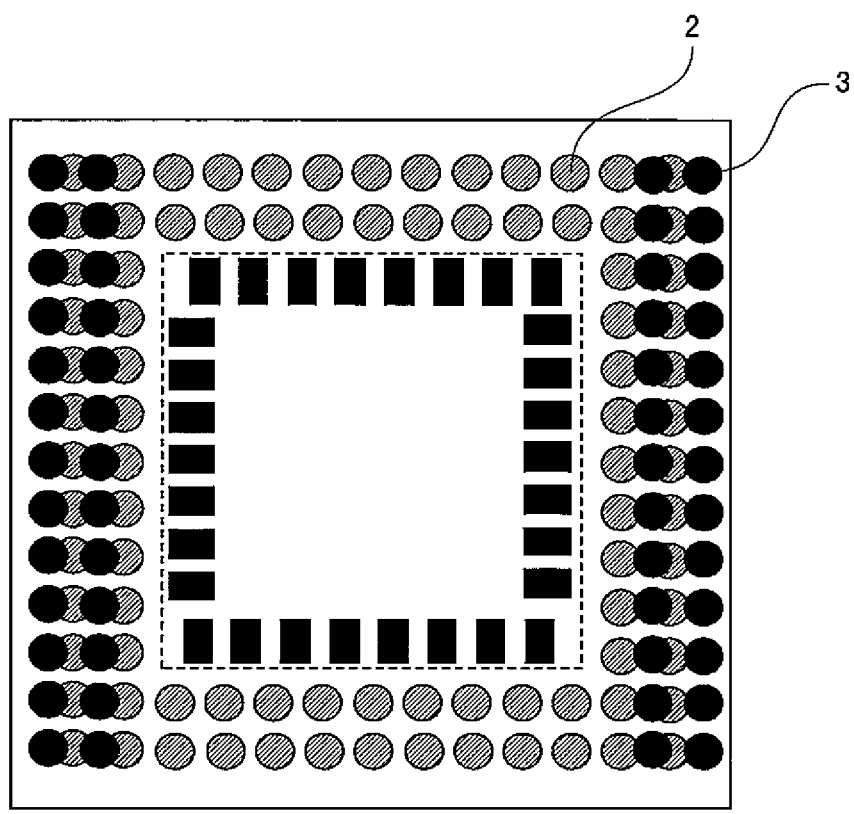
FIG. 7 is an illustrative diagram of problems.
Figure 8:
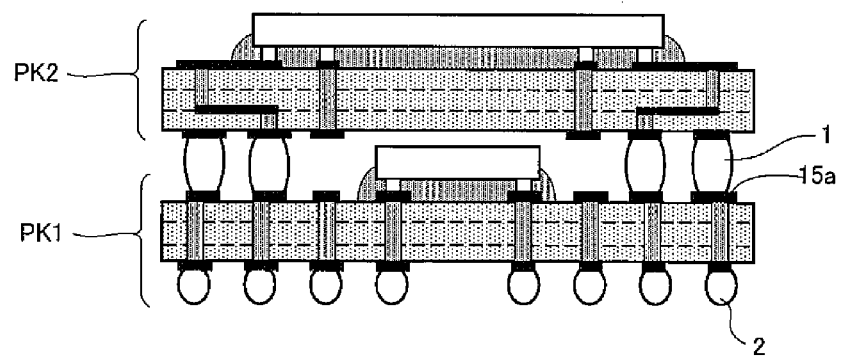
FIG. 8A is a cross-sectional diagram of a stacked semiconductor module described in a prior art example.
FIG. 8B is a plan diagram of a bonding surface of a lower layer module according to the prior art example.
Figure 8:
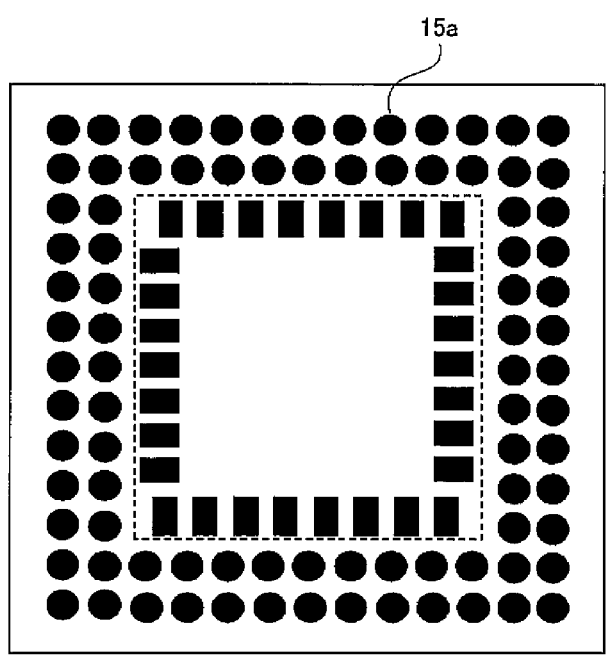
Figure 9:
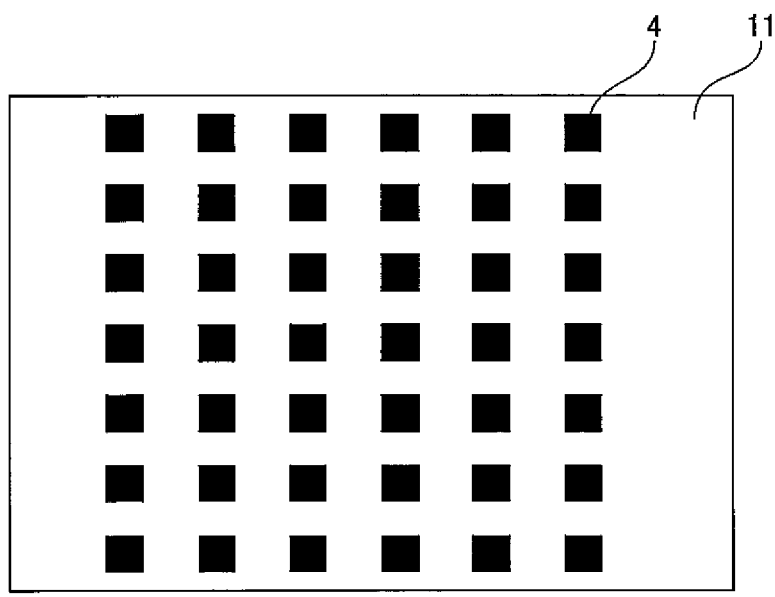
FIG. 9 is a plan diagram showing the shape of lands described in a further prior art example.

Furthermore, in the lower layer module, it is also possible to make the pitch of the opening sections 3 in the upper layer module equal to the pitch of the first connection terminals 2. If the pitch is equal, then since the external connection terminals in the upper layer and lower layer modules have the same circular shape, have virtually the same size, and are arranged at even spacing, as shown in FIG. 7, it is difficult to distinguish the external connection terminals by means of an X-ray or SAT inspection from above as described above. In the present embodiment, however, the opening sections 30 of the lower module to which the upper layer module PK22 is connected as shown in FIG. 4 have a polygonal shape, which is different from the circular shape of the first connection terminals 2 in the lower layer module, and this outer shape is larger than the diameter of the first connection terminals 2 of the lower layer module and can be distinguished readily by transmissive observation.

Moreover, when an upper layer module having connection terminals 30 of a general-purpose ball shape is bonded to and stacked on the lower layer module as described above, then the bottom surface of each connection terminal 30 of the upper layer module exhibits a polygonal shape in a stacked semiconductor module state, whereas the unbonded positions continue to have a circular shape. In addition to such a difference in shape, the size is greater than the diameter of the connection terminals 30 of the upper layer module. Consequently, the presence or absence of a bond can be distinguished clearly from above in a transmissive inspection by X-ray observation or the like.

If the size of the opening section is not greater than the diameter of the connection terminal 30, then when observed by transmission from the upper side, the polygonal shape of the bottom surface is concealed by the connection terminal 30 itself, the circular shape of the diameter of the terminal is visible as a transmission image, and it is not possible to distinguish the unbonded case. Furthermore, the change in the bottom surface shape of the connection terminals described above only involves changing the pad shape to a polygonal shape as described above, from before connection to after connection, in other words, in the process of manufacturing the respective upper and lower semiconductor modules from before stacking to after stacking only, without any special processing, and therefore it is easy to use the existing processing steps and general-purpose modules. Furthermore, when the opening sections and the external connection terminals are viewed on a projected plane, then a difference with respect to the circular shape can readily be recognized clearly if the linear portions or angled portions of the polygonal shapes of the opening sections are visible. In other words, here, the shape of the opening section 3 is polygonal, and the bottom surface of the connection terminal 30 also has a polygonal shape. The size of the opening section 3 is larger than the diameter of the connection terminal 30 in the upper layer module. Alternatively, the size of the opening section 3 is larger than the diameter of the first connection terminal 2 in the lower layer module. Additionally, it may be larger than both of the terminals.

In the embodiment described above, the planar shape of the opening sections 3 is different from the planar shape of the first connection terminals 2, and the outer shape of the opening sections 3 is larger than the first connection terminals 2, but similar beneficial effects can be expected even if the planar shape of the opening sections 3 is different from the planar shape of the first connection terminals 2 and the outer shape of the opening sections 3 protrudes beyond the first connection terminals 2 when inspected by transmission in the stacking direction of the first connection terminals 2 and the opening sections 3.

In the embodiment described above, the planar shape of the opening sections 3 is different from the planar shape of the connection terminals 30 and the planar shape of the first connection terminals 2 which are formed on the other surface of the first substrate 11. One end of each connection terminal 30 is connected to the second substrate 25, and the other end thereof melts and solidifies and fills up an opening section 3, so that the other end is bonded to the pad 15. The outer shape of the opening section 3 is larger than the connection terminal 30 and the first connection terminal 2. However, similar beneficial effects can be expected even if the planar shape of the opening sections 3 is different from the planar shape of the connection terminals 30 and the planar shape of the first connection terminals 2 formed on the other surface of the first substrate 11, and one end of each connection terminal 30 is connected to the second substrate 25, and the other end thereof melts and solidifies and fills up the opening section 3, so that the other end is bonded to the pad 15, and the outer shape of the opening section 3 protrudes beyond the connection terminal 30 and the first connection terminal 2 when inspected by transmission in the stacking direction of the first connection terminal 2 and the opening section 3.

Furthermore, in the embodiment described above, in a state where all of the module-to-module connection terminals which are the objects of inspection have been inspected by transmission in the stacking direction of the external connection terminals and the opening sections of the upper layer module connection pads, the outer shape of the opening sections of the upper layer module connection pads may protrude beyond the module-to-module connection terminals and the external connection terminals. In this case, since whether or not all of the connection terminals which are the objects of inspection are satisfactory can be determined by means of a simple transmissive inspection process, then it is also possible to eliminate the need for an electrical inspection of open connections or shorted connections.

Furthermore, if the opening sections of the upper layer module connection pads have a combination of a circular shaped portion and a differently shaped portion, the differently shaped portion with respect to the external connection terminal is included in a protruding portion when the shapes are observed by transmission. By this means, even if differently shaped portions are provided locally due to design restrictions, these can be distinguished by a transmissive inspection although they are in a restricted region. For example, in the case of the circular shape of the external connection terminal, a linear shape may be formed in the aforementioned protruding portion.

Moreover, the height of the opening sections of the upper layer module connection pads may be equal to or less than half the height of the module-to-module connection terminals. Furthermore, specifically, the height of the module-to-module connection terminals is 300 μm to 400 μm, and the height of the pad opening sections with respect to the pad surface is 5 μm to 20 μm. By sufficiently reducing the height of the pad opening sections in this way, the following beneficial effects can be obtained.

A characteristic connection defect of the present stacked module is a case where a terminal contacts the surface of the upper layer module connection pad, and electrical continuity is maintained only temporarily. This phenomenon occurs because after the terminal solder has been heated and melted, the solder has not wetted and spread on the pad and has solidified in this state, meaning that the original terminal shape is almost maintained in positions where the terminal may or may not contact the pad surface. If the pad opening section has a height close to that of the connection terminal, then even in a state where the solder has not wetted and spread on the pad, the connection terminal melts while the shape follows the side faces of the pad opening section, and thus the transmitted shape viewed from the upper surface displays the shape of the pad opening section and this defect cannot be distinguished by a transmissive inspection. On the other hand, in the present invention, the height of the pad opening section is low, being equal to or lower than one half of the height of the connection terminal, and thus it is possible to distinguish between an abnormal state where only the above-described contact is made and a normal state where the terminal has wetted and spread and made a connection, by means of a simple transmissive inspection, on the basis of a difference in the shape of the bottom surface.

The present invention contributes to an improvement in the reliability of small electronic devices of various types, such as small devices, portable telephones, digital still cameras and video cameras.

The invention claimed is:

1. A semiconductor module for stacking, comprising:
   a first substrate having first and second surfaces;
   a first semiconductor chip mounted on the first surface of the first substrate;
   a plurality of first pads on the second surface of the first substrate;
   a plurality of second pads electrically connectable to an upper layer module, provided on the first surface of the first substrate outside a holding region of the first semiconductor chip; and
   a plurality of first connection terminals made of a solder formed on the plurality of first pads, wherein
   a plurality of opening sections are formed so as to expose the plurality of second pads in an insulating film covering portions of the plurality of second pads on the first surface of the first substrate,
   a planar shape of each of the plurality of opening sections is a polygon, and a planar shape of each of the plurality of first connection terminals is a circle,
   a portion of an outer shape of each of the plurality of opening sections protrudes beyond each of the plurality of first connection terminals when inspected by transmission in a stacking direction,
   the outer shape of each of the plurality of opening sections is larger than a diameter of each of the plurality of first connection terminals,
   a pitch of the plurality of opening sections and a pitch of the plurality of first connection terminals are equal, and
   a plurality of conductive materials connecting each of the plurality of first pads and each of the plurality of second pads respectively are formed in the first substrate, and a whole outer shape of each of the conductive materials is within an outer shape of each of the plurality of first connection terminals in a stacking direction.

2. The semiconductor module for stacking according to claim 1, wherein the outer shape of each of the plurality of opening sections is at least 15 μm larger than the diameter of each of the plurality of first connection terminals.

3. A stacked semiconductor module, comprising:
   a first substrate having first and second surfaces;
   a second substrate;
   a first semiconductor chip mounted on the first surface of the first substrate;
   a second semiconductor chip mounted on the second substrate;
   a plurality of first pads on the second surface of the first substrate; and
   a plurality of second pads electrically connectable to the second substrate, provided on the first surface of the first substrate outside a holding region of the first semiconductor chip, wherein
   the second substrate is stacked on top of the first surface of the first substrate, the first substrate and the second substrate are connected by a plurality of second connection terminals made of a solder,
   a plurality of opening sections are formed so as to expose the plurality of second pads in an insulating film covering portions of the plurality of second pads on the first surface of the first substrate, a planar shape of each of the plurality of opening sections is a polygon, and a planar shape of each of the plurality of second connection terminals and a planar shape of each of a plurality of first connection terminals made of a solder formed on the plurality of first pads on the second surface of the first substrate are circles, one end of each of the plurality of second connection terminals, an other end of which is connected to the second substrate, melts and solidifies, fills each of the plurality of opening sections and is bonded to each of the plurality of second pads, respectively, and a portion of an outer shape of each of the plurality of opening sections protrudes beyond each of the plurality of second connection terminals and each of the plurality of first connection terminals when inspected by transmission in a stacking direction, a portion of an outer shape of each of the plurality of opening sections protrudes beyond each of the plurality of first connection terminals when inspected by transmission in a stacking direction, the outer shape of each of the plurality of opening sections is larger than a diameter of each of the plurality of first and second connection terminals, a pitch of the plurality of opening sections and a pitch of the plurality of first connection terminals are equal, and a plurality of conductive materials connecting each of the plurality of first pads and each of the plurality of second pads respectively are formed in the first substrate, and a whole outer shape of each of the conductive materials is within an outer shape of each of the plurality of first connection terminals in a stacking direction.

4. The stacked semiconductor module according to claim 3, wherein a height of the plurality of opening sections is equal to or less than one half of a height of the plurality of second connection terminal.

5. The stacked semiconductor module according to claim 3, wherein the outer shape of each of the plurality of opening sections is at least 15 μm larger than a diameter of each of the plurality of first and second connection terminals.

* * * * *